United States Patent
Van Drieënhuizen et al.

(10) Patent No.: US 7,593,094 B2
(45) Date of Patent: Sep. 22, 2009

(54) PATTERNING DEVICE

(75) Inventors: Bert Pieter Van Drieënhuizen, Veldhoven (NL); Antonius Johannes Maria Montagne, Delft (NL); Jeroen-Frank Dekkers, 's-Hertogenbosch (NL); Paul Klatser, Markelo (NL); Marcus Hagting, Enschede (NL)

(73) Assignee: ASML Netherlands B.V., Veldhoven (NL)

( * ) Notice: Subject to any disclaimer, the term of this patent is extended or adjusted under 35 U.S.C. 154(b) by 542 days.

(21) Appl. No.: 11/474,493

(22) Filed: Jun. 26, 2006

(65) Prior Publication Data

US 2007/0296944 A1    Dec. 27, 2007

(51) Int. Cl.
     *G03B 24/54*     (2006.01)
     *G03B 24/42*     (2006.01)
(52) U.S. Cl. ........................................ 355/67; 355/53
(58) Field of Classification Search ................ 355/53, 355/67; 385/18; 359/290, 298
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0111786 A1* | 5/2005 | Boie et al. | 385/18 |
| 2006/0285094 A1* | 12/2006 | Reijnen et al. | 355/53 |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Peter B Kim
(74) *Attorney, Agent, or Firm*—Sterne, Kessler, Goldstein & Fox P.L.L.C.

(57) ABSTRACT

A system and method allow for a more effective and efficient patterning device architecture and control arrangement. A lithography apparatus comprises an illumination system, a patterning device, and a projection system. The illumination system is configured to condition a beam of radiation. The patterning device is configured to pattern the beam of radiation. The patterning device comprises a control system and an array of individually controllable elements. The control system is configured to convert analog signals having respective first voltage values to corresponding differential control signals having second, higher voltage values. Corresponding ones of the individually controllable elements in the array of individually controllable elements are configured to actuate based on receiving a corresponding one of the differential control signals. The projection system is configured to project the patterned beam onto a target area of a substrate.

39 Claims, 12 Drawing Sheets

PATTERNING DEVICE

BACKGROUND

1. Field of the Invention

The present invention relates a lithographic apparatus and device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

It is desired to have patterning devices with large numbers of individually controllable elements, e.g., in the 10 million range, in order to provide smaller and smaller features with higher resolutions. However, information handling capability of existing patterning device transistors is too low because of a large required energy (e.g., amount of information) per individually controllable device (bit), e.g., approximately 500 nJ/bit. A total system power required to drive the patterning device is too large because of the high input voltage (e.g., greater than about 20 V). At this power, the heat generated in the device from processing the information required to control a large amount of the individually controllable elements could damage or destroy the device. Also, a single-ended signal path architecture of the current devices introduces a serious limit to the resolution and linearity of movement of the individually controllable devices (e.g., limited to 8 bits), where at least 10 bits are desired. The two-quadrant architecture of the current devices introduces serious limits to timing margins, offset, and gain adjustments. Fabrication of the current devices requires high-voltage IC technology, which is not compatible with high-speed IC technology. The large mirror sizes (e.g., 16×16 µm) of the current devices limits the number of pixels per chip to about 2,000,000. The use of aluminum mirrors requires special operation conditions to reduce the influence of mechanical memory effects (e.g., hysteresis) and limits the mechanical life-time and the pattern data update rate of the device (e.g., a maximum update rate of about 2 kHz). Furthermore, most of the current devices have no on-chip electronics for automated self-test, temperature measurement, and special addressing modes for clustered mirrors.

Therefore, what is needed is a more effective and efficient patterning device architecture and control arrangement.

SUMMARY

In one embodiment of the present invention, there is provided a lithography apparatus comprising an illumination system, a patterning device, and a projection system. The illumination system is configured to condition a beam of radiation. The patterning device is configured to pattern the beam of radiation. The patterning device comprises a control system and an array of individually controllable elements. The control system is configured to convert received analog signals having respective first voltage values to corresponding differential control signals having second, higher voltage values. Corresponding ones of the individually controllable elements in the array of individually controllable elements are configured to actuate based on receiving a corresponding one of the differential control signals. The projection system is configured to project the patterned beam onto a target area of a substrate.

In another embodiment of the present invention, there is provided a method including the following steps. Differential control signals having respective first voltages are generated from analog input signals having second, lower voltages. Respective ones of individually controllable elements within an array of individually controllable elements are controlled using corresponding ones of the differential control signals. A beam of radiation is patterned using the array of individually controllable elements. The patterned beam is projected onto a target portion of a substrate.

In a further embodiment of the present invention, there is provided a patterning device comprising a control system and an array of individually controllable elements. The control system is configured to convert analog signals having respective first voltage values to corresponding differential control signals having second, higher voltage values. Corresponding ones of the individually controllable elements in the array of individually controllable elements being configured to actuate based on receiving a corresponding one of the differential control signals.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
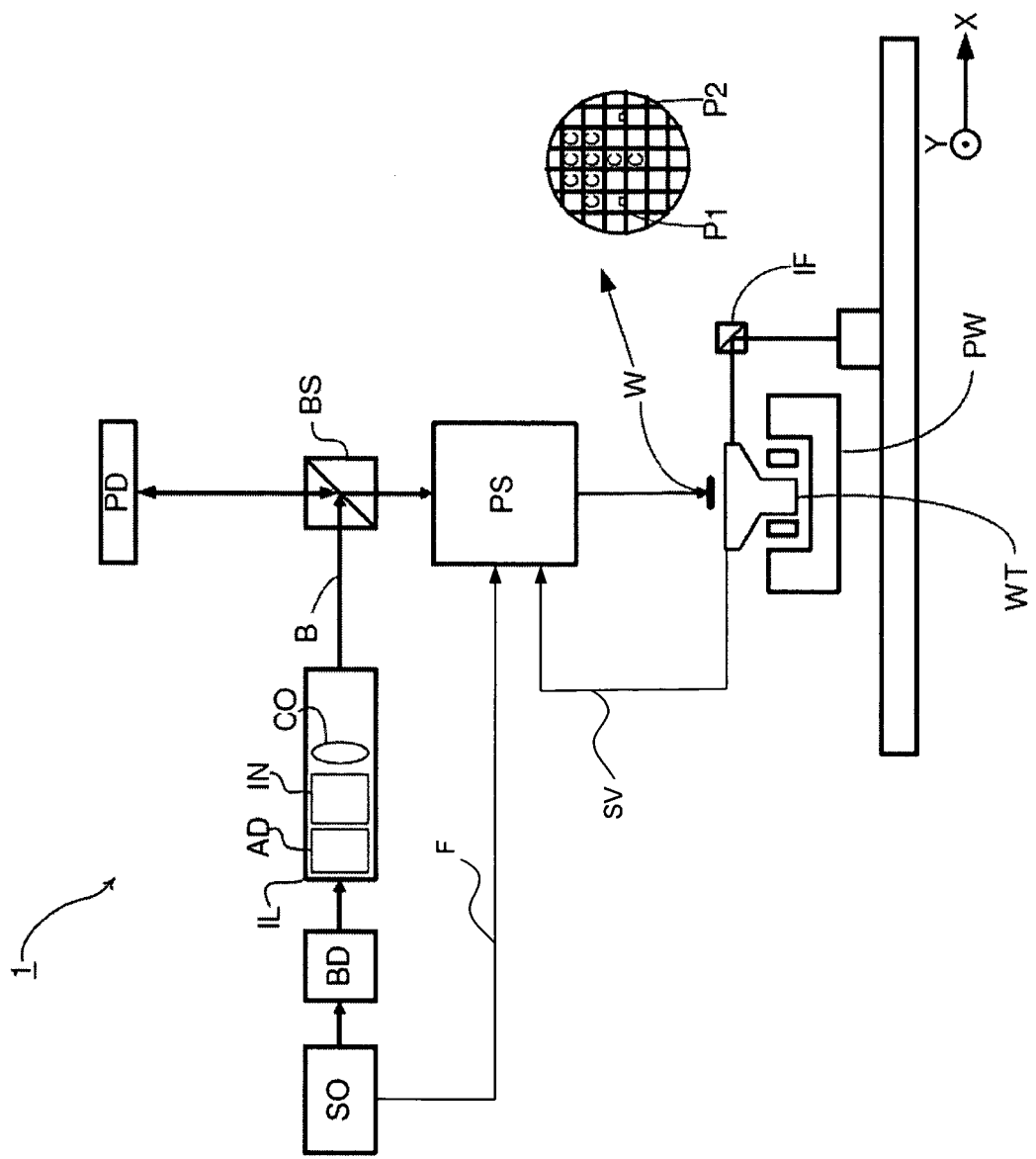
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate may be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA may be movable (e.g., with the use of one or more actuators) at least in the direction to and away from the substrate. Being able to move the MLA to and away from the substrate allows, e.g., for focus adjustment without having to move the substrate.

Figure 2:
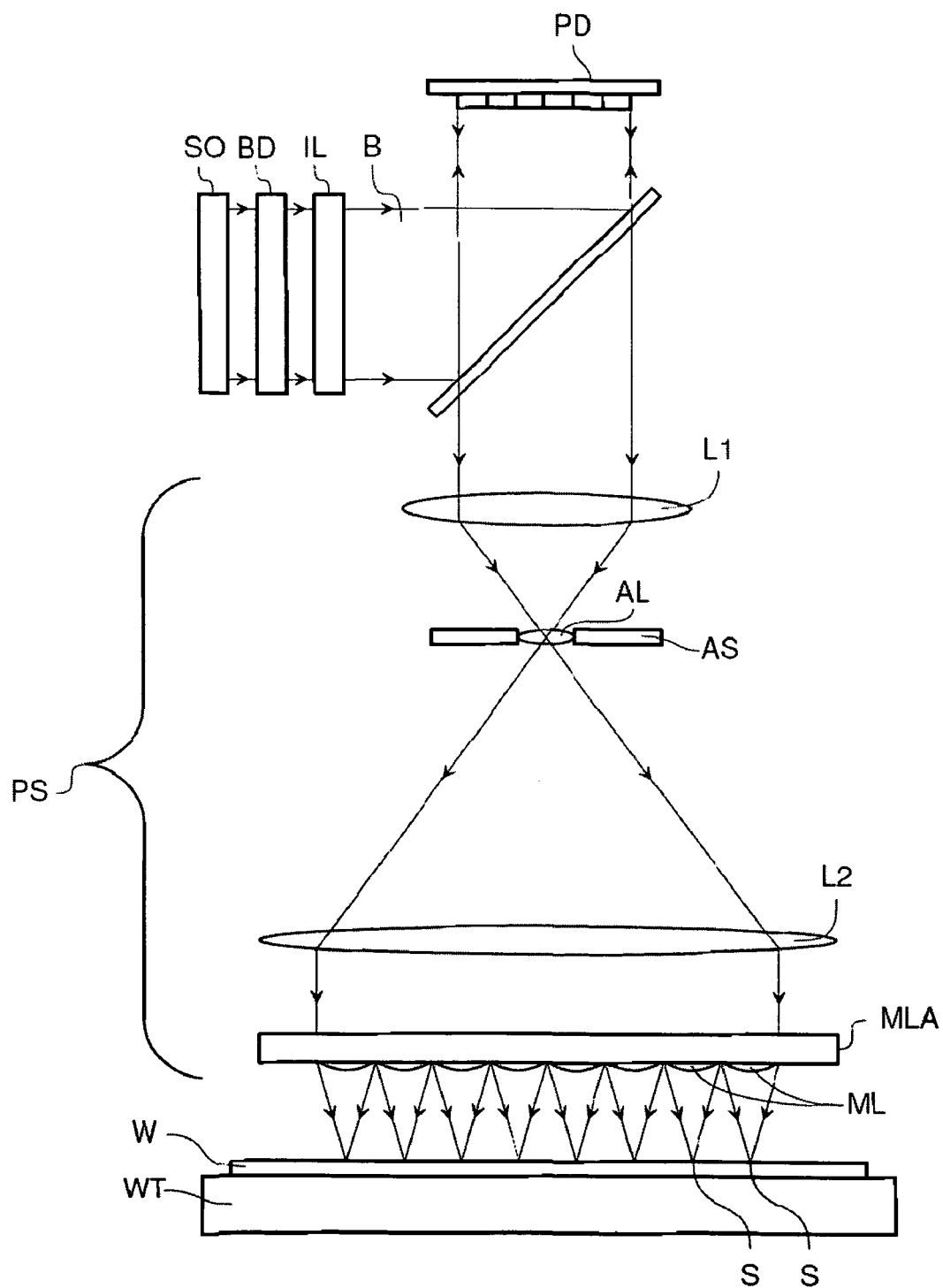

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system.

Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation may have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
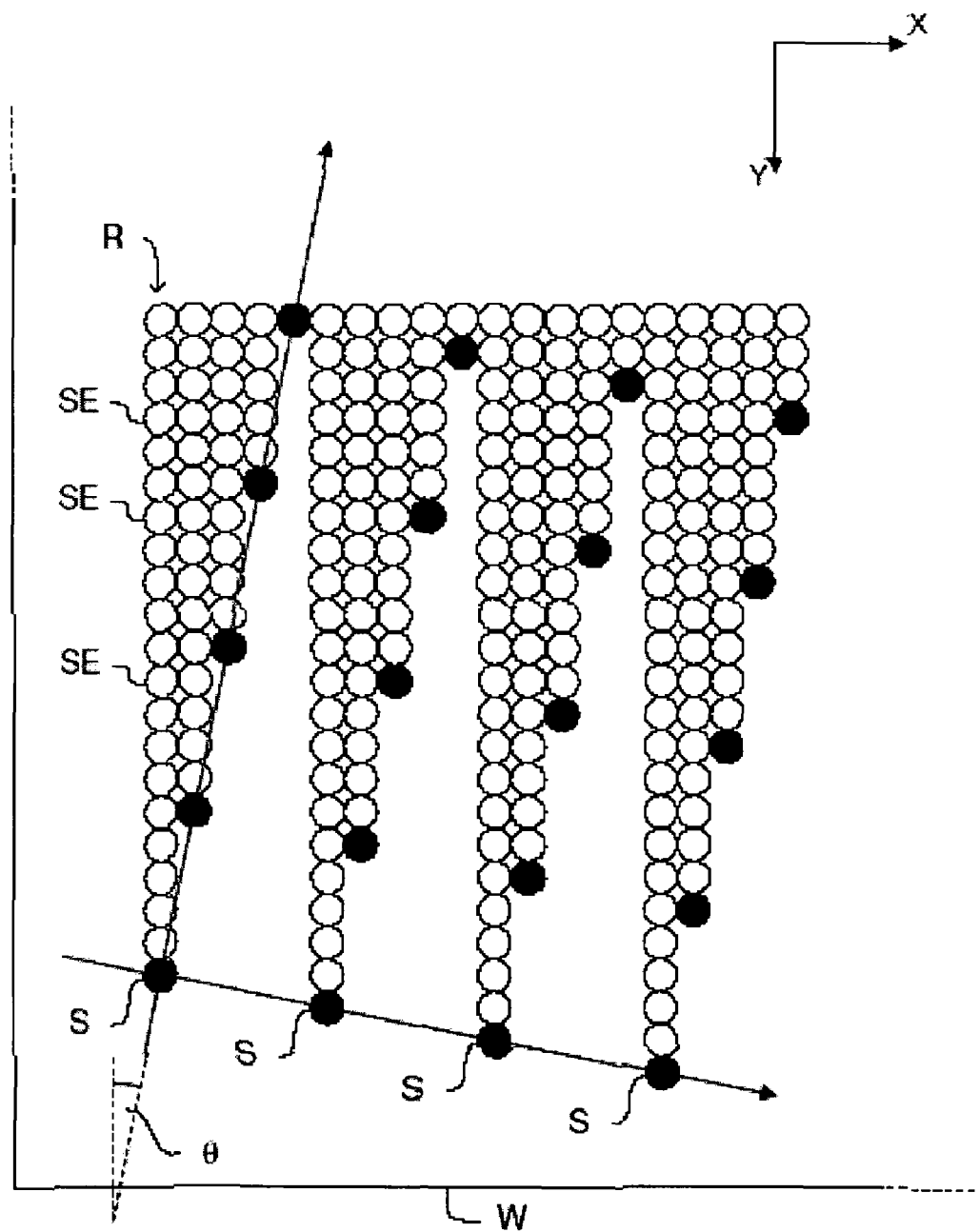
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
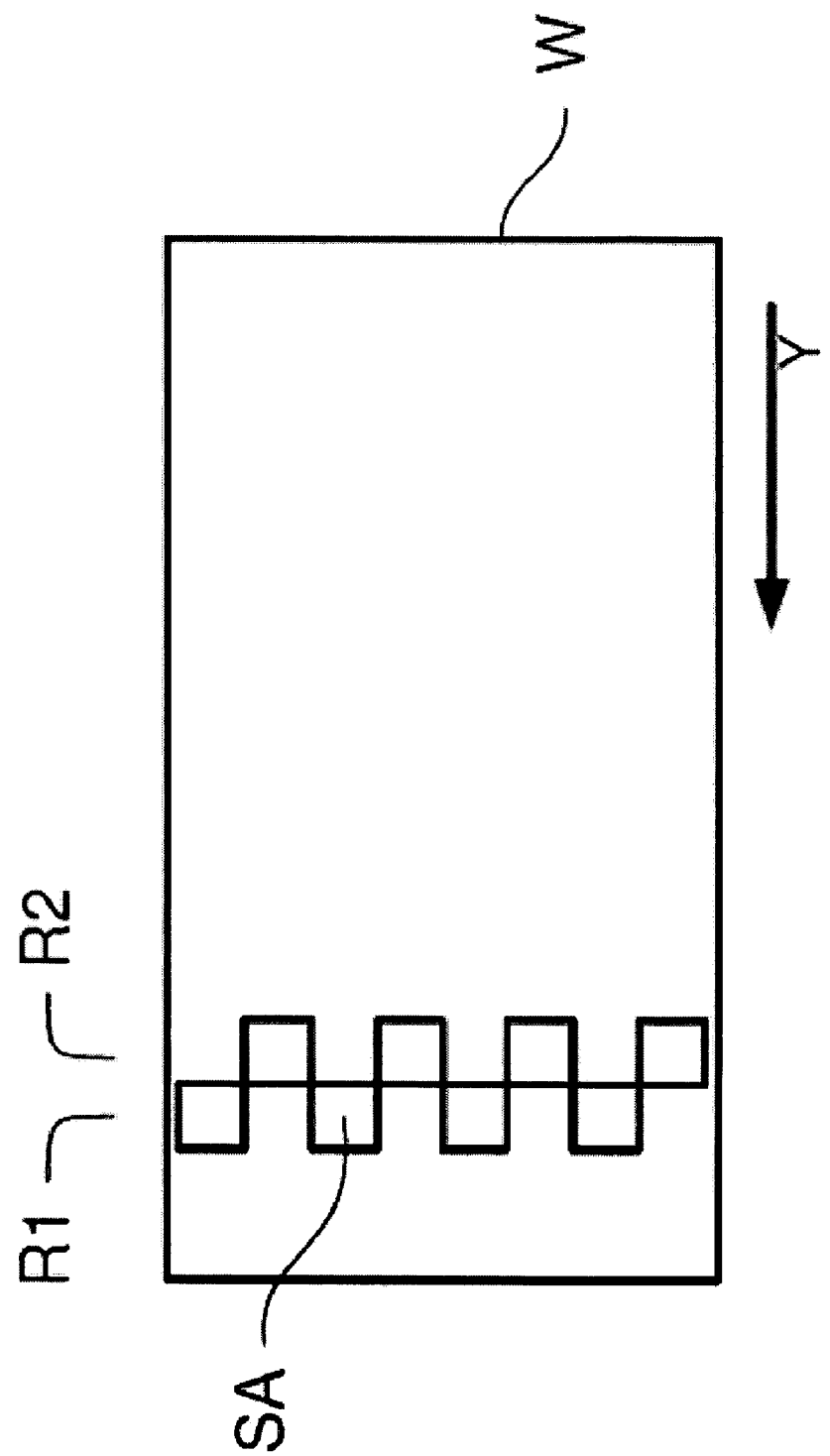
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
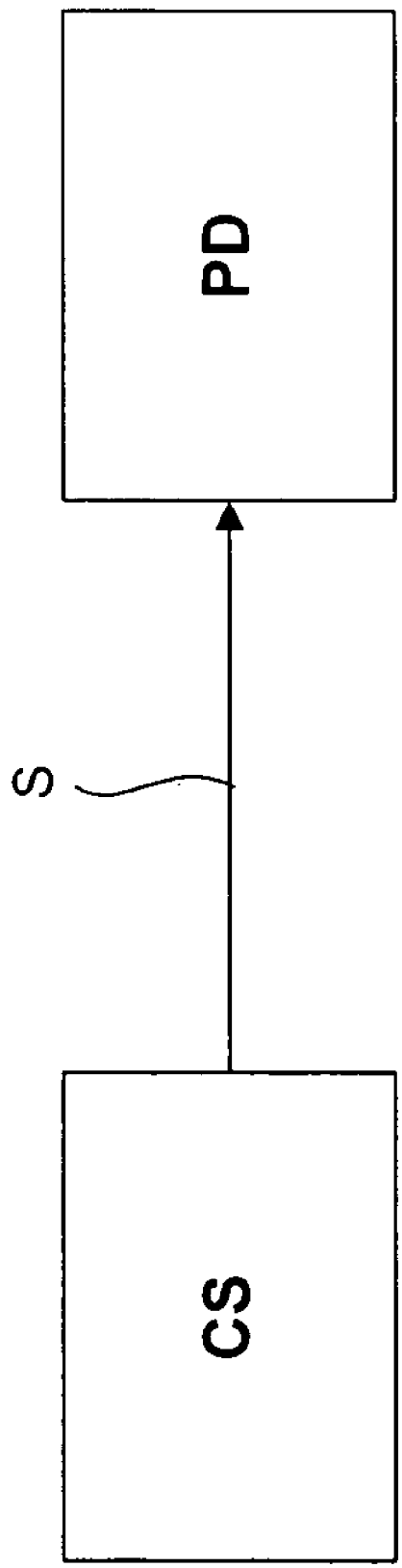
FIG. 5 shows a control system and patterning device, according to the present invention.

FIG. 5 shows a control system CS and patterning device PD, according to the present invention. For example, the pattern device PD can be located in a lithography system as shown in FIGS. 1 and 2. Alternatively, control system CS can be part of patterning device PD.

In order to form the required pattern on a substrate W (see FIGS. 1 and 2), it is necessary to set each of the individually controllable elements in the patterning device PD to the requisite state at each stage during the exposure process. Therefore, control signals S, representing the requisite states, must be transmitted to each of the individually controllable elements. Control system CS generates the control signals S. The pattern to be formed on the substrate W can be provided to the lithographic apparatus in a vector-defined format, such as GDSII. In order to convert the design information into the control signals S for each individually controllable element, the control system CS can include one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

Figure 6:
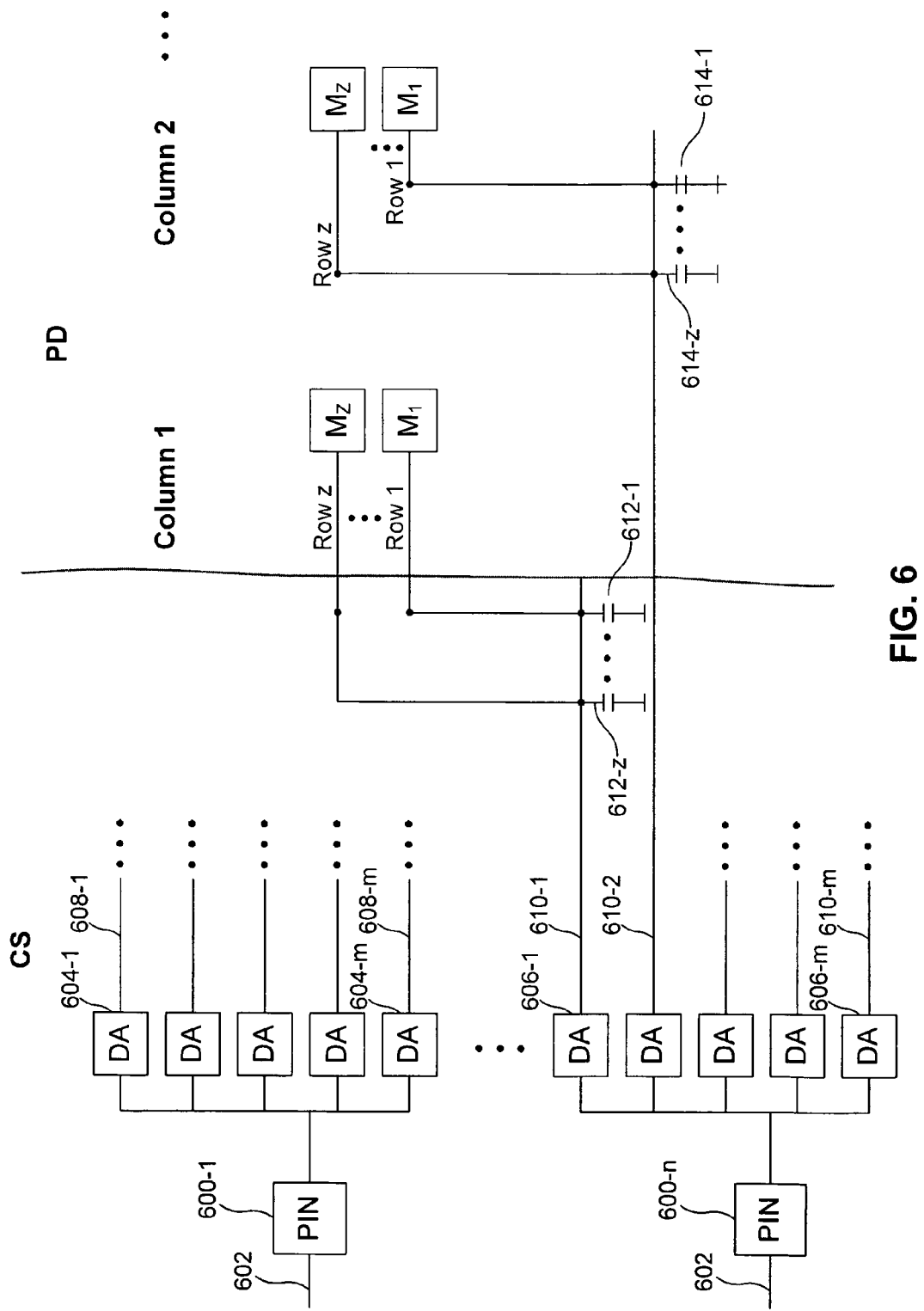
FIGS. 6 and 7 show alternative configurations for portions of the control system and the patterning device in FIG. 5.
Figure 7:
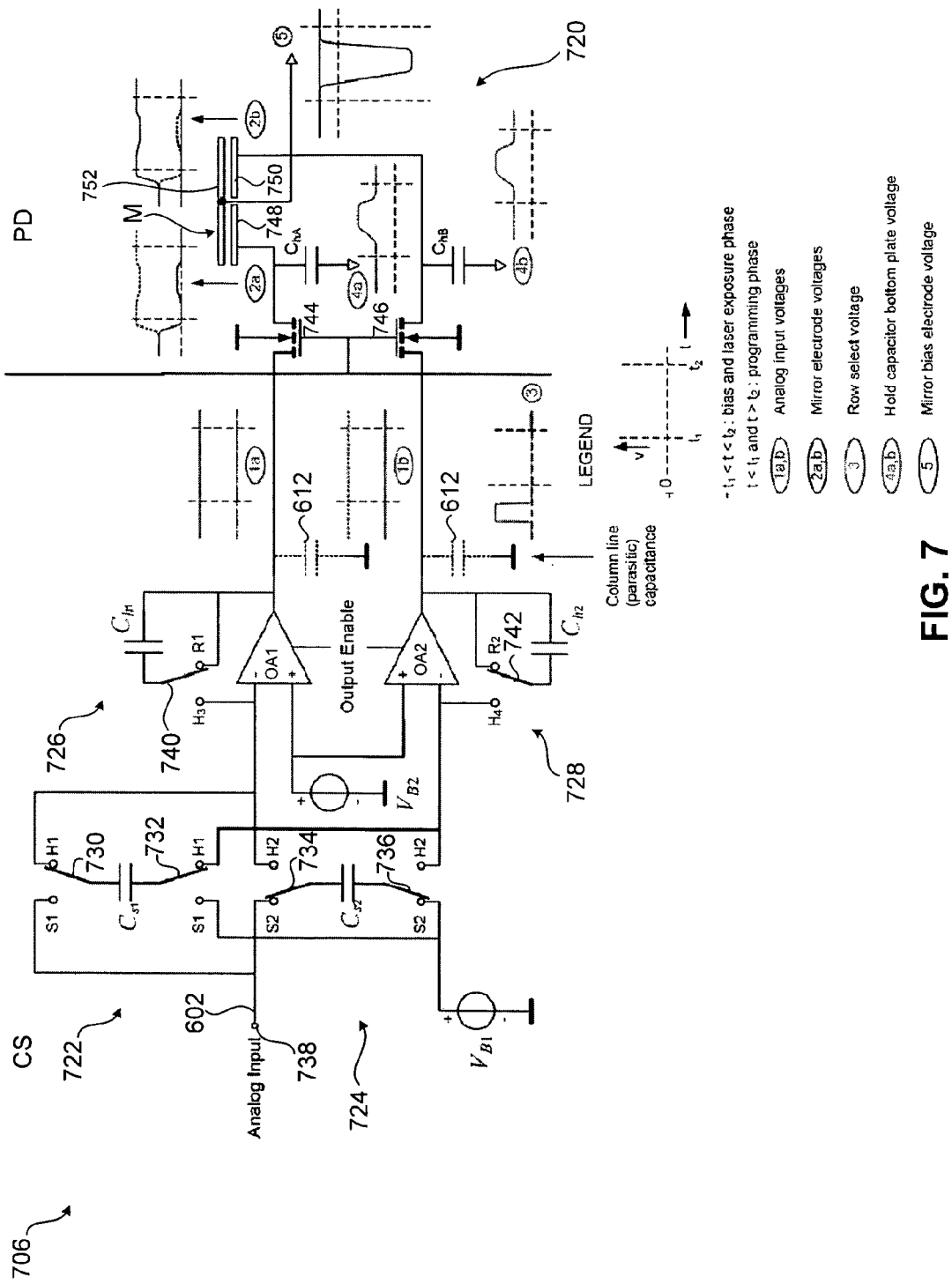

FIGS. 6 and 7 show alternative configurations for portions of the control system CS and the patterning device PD in FIG. 5.

With regards to FIG. 6, control system CS includes pins 600-1 to 600-$n$ ($n$ being an integer greater than 1) that receive a respective portion of an analog input signal 602. Analog signal 602 can be a single-ended signal. Pin 600-1 is coupled to a plurality of differential amplifiers 604-1 to 604-$m$ ($m$ being an integer greater than 1). Similarly, pin 600-$n$ is coupled to a plurality of differential amplifiers 606-1 to 606-$m$. In one example, five differential amplifiers are coupled to each pin, so m=5. Each differential amplifier 604 converts the received portion of analog signal 602 into a differential signal 608. Similarly, each differential amplifier 606 coverts the received portion of analog signal 602 into a differential signal 610.

As discussed above, patterning device PD can include an array of individually controllable devices M1 to Mz (z being an integer greater than 1). For example, mirrors can be used as the individually controllable devices. The case where individually controllable devices are rotating mirrors is discussed below merely for illustrate purposes. In one example, the array can have four quadrants, each quadrant including 2600 columns and 1050 rows, or about 10,000,000 total mirrors M.

Differential amplifiers 606-1 and 606-2 coupled to pin 600-$n$ will be used in the description below merely as examples of how all differential amplifiers interact with patterning device PD. Each differential amplifier 606 is coupled to one column of each quadrant of patterning device PD. Thus, in the example above, with four quadrants of 2600 columns each, there would be about 10,000 differential amplifiers 606. Each signal path between differential amplifier 606-1 and the patterning device PD includes a set of capacitors 612-1 to 612-$z$. The number of capacitors 612 corresponds to a number of rows 1 to Z in a corresponding column of patterning device PD. (Similarly, each signal path between differential amplifier 606-2 and the patterning device PD includes a set of capacitors 614-1 to 614-$z$.)

With reference to FIG. 7, for each differential column line (610-1, 610-2), a switch 744 or 746 from which the control input (gate) is connected to one of the row select lines (Rowz), is placed between the differential column line (610-1, 610-2) and the control electrodes of one of the (z) controllable elements. For example, switches 744 and 746 can be transistors, e.g., MOS transistors, as is used in the discussion below. Gates of transistors 744 and 746 are connected to row select lines and at their sources to one electrode of capacitors ChA and ChB. A row select signal 3 on a respective one of the row select lines (not numbered in FIGS. 6 and 7) is used to control which row address from 1 to z in the respective column receives a presently generated signal 610.

With continuing reference to FIG. 7, and reference again to FIG. 6, between each pulse of a radiation source SO (see FIGS. 1 and 2), every mirror M in patterning device PD needs to be programmed, as discussed in more detail below. Thus, for the example discussed above, pin 600-$n$ needs to receive 5250 analog signals 602 between each pulse. The 5250 signals 602 are split evenly between the five differential amplifiers 606. Thus, each differential amplifier 606 receives 1050 analog signals 602, which corresponds to the 1050 mirrors in each column of the patterning device PD associated with that differential amplifier 606. As discussed above, a row select signal on a gate of the NMOS switches 744 and 746 controls which mirror M receives differential signal 610 at a given time. Transmission of signals 610 can occur sequentially from mirror M-1 to mirror M-z. Using the example above, when a 6 kHz radiation source SO is used, each differential amplifier 606 needs to be updated with new analog signals 602 (e.g., pattern data) at a rate of about 6 MHz (about 1050 times higher than the pulse period because about 1050 mirrors need to be programmed) and pin 600-$n$ needs to be updated at a rate of about 30 MHz, since it needs to send analog signals 602 to five differential amplifiers 606. This equals about 30 ns to sample each signal 602.

Turning now to FIG. 7, an exemplary configuration for differential amplifier 706 and a driving circuit 720, which drives each mirror M in patterning device PD, is shown. Differential amplifier 706 includes first and second switched capacitor systems 722 and 724 and first and second amplifier systems 726 and 728.

First switched capacitor system 722 comprises a capacitor Cs1 coupled between switches 730 and 732. Switches 730 and 732 move between contacting sampling nodes S1 and hold nodes H1. Similarly, second switched capacitor system 724 comprises a capacitor Cs2 coupled between switches 734 and 736. Switches 734 and 736 move between contacting sampling nodes S2 and hold nodes H2. First and second switched capacitor systems 722 and 724 are coupled to an analog input node 738 and a bias source VB1.

First amplifier system 726 includes an operational amplifier OA1 having a feedback path between a negative terminal and an output terminal including a capacitor Ch1 and a switch 740. Switch 740 moves between a hold node H3, which is also coupled to the negative terminal, and a reset node R1, which is also coupled to the output terminal.

Similarly, second amplifier system 728 includes an operational amplifier OA2 having a feedback path between its negative terminal and output terminal. The feedback path includes a capacitor Ch2 and a switch 742. Switch 742 moves between a hold node H4, which is also coupled to the negative terminal, and a reset node R2, which is also coupled to the output terminal.

Positive terminals of both operational amplifiers OA1 and OA2 are coupled to a bias source Vb2. Sample nodes S1 and S2 are coupled together, as are holds nodes H1, H2, H3, and H4.

As discussed above, a plurality of capacitors (e.g., similar to capacitors 612 and 614 shown in FIG. 6, with only one being shown in FIG. 7 in phantom as an example) are coupled to the output of each of operational amplifiers OA1 and OA2. Although shown outside of circuit 720, it is to be appreciated that these capacitors are not directly coupled to the output of the amplifiers OA1 and OA2, but through respective switches 744 and 746, from which the control input (gate) is coupled to one of the row select signals (Rowz). Again, these switches 744 and 746 are used to control which row receives differential signal 608/610 in a respective column at a moment in time.

Driving circuit 720 can include first and second field effect transistors 744 and 746 (e.g., N type FETS), first and second capacitors ChA and ChB, and first and second electrodes 748 and 750. First transistor 744, capacitor ChA, and electrode 748 process, store, and utilize a first portion (e.g., one of a positive or negative portion) of differential signal 608/610, while second transistor 746, capacitor ChB, and electrode 750 process, store, and utilize a second portion (e.g., the other of the positive or negative portion) of differential signal 608/610. Mirror M comprises a bias electrode portion 752, which is biased using a bias source (not shown).

In one example, all lower plates of first capacitors ChA in all driving systems 720 of a quadrant can be coupled together, all lower plates of all second capacitors ChB of all driving systems 720 of a quadrant can be coupled together, and all bias electrodes 752 from all the mirrors on the patterning device PD can be coupled together. In this configuration, all the sets of coupled together elements can be biased using a single corresponding bias source.

In a first stage, amplifiers OA1 and OA2 are not enabled. During this stage, the outputs of the amplifiers OA1 and OA2 are disabled (i.e., they have an inactive, high impedance output). Alternatingly, capacitor Cs1 and Cs2 in the first and second switching capacitor systems 722 and 724 are connected to analog input 602 and bias source VB1. Analog input signal 602 can range from about 0 to 2 V, e.g., about 1.667 V, and bias source VB1 can be a midrange of this voltage, or about 1 V. In alternating time periods, a charge is stored on capacitors Cs1 and Cs2 in respective first and second systems 722 and 724. Thus, during each time period switches 730/732 and 734/736 are contacting opposite ones of sample or hold nodes S1, S2, H1, and H2, respectively. Switches 740 and 742 are connected to reset contacts R1 and R2, respectively, which means capacitors Ch1 and Ch2 are discharged. When disconnected from the amplifiers OA1 and OA2, capacitors Ch1 and Ch2 can be configured so that they will not significantly change a value of the output voltage of the amplifiers OA1 and OA2.

During a next stage, switches 730, 732, 734, 736, 740, and 742 move to the opposite nodes from where they had been, placing capacitors Cs1, Cs2, Ch1, and Ch2 in an opposite state. Amplifiers OA1 and OA2 remain not enabled, but charges from the charged one of capacitor Cs1 or Cs2 is distributed to capacitors Ch1 and Ch2. When connecting Ch1 in series with Cs and Ch2 and in parallel to column lines, column voltages on column capacitors 612/614 may change a little. However, since Ch1 and Ch2 have relatively smaller capacitances than the capacitance of column capacitors 612/614, e.g., about 10% as large, there should be no overall effect.

During a next stage, amplifiers OA1 and OA2 are enabled at their output enable nodes, e.g., they are turned ON. Because the amplifiers OA1 and OA2 are operational, their negative and positive terminals should have equal inputs, for example through the use of bias source VB2 (e.g., an offset voltage). The voltage of bias source VB2 can be around 3V. At this point, one of capacitors Ch1 and Ch2 holds a positive charge, while the other one of these capacitors Ch1 and Ch2 holds a negative charge, for example with respect to bias source VB2. In this stage, these positive and negative charges form the differential signal 608/610 that is transmitted to the respective drive circuit 720 in the respective row or the respective column of the patterning device PD.

Driving circuit 720 operates in one of two states, programming or exposure/light pulsing. During the programming phase, FETS 744 and 746 from Row1 to Rowz are sequentially switched on, such as to connect the mirror electrodes and the electrodes of their corresponding capacitors ChA and ChB to the differential output of the amplifiers OA1 and OA2. The differential signal 608/610 is transferred and stored on respective ones of capacitances ChA and ChB via FETS 744 and 746. Respective electrodes 748 and 750 also are biased by the stored voltage. However, because signal 2a is positive and signal 2b is negative (e.g., the differential signals stored on capacitances ChA and ChB), with respect to 3V bias (reference level) applied to bias electrode 752, the mirror M does not move during the programming mode.

During exposure mode, both FETS 744 and 746 are turned OFF and a negative bias signal 5 can be applied to bias electrode 752, which signal can be about −20 to −30 V. Mirror M begins to actuate when signal 5 is applied to bias electrode 752 because at this point there is a difference in absolute value between the potential at the electrodes 748 and 750 caused by charges in respective capacitors ChA and ChB and the bias electrode 752. However, the rotating of mirrors M is not performed until all mirrors in the patterning device have been programmed.

During the exposure phase, in some instances an amount of voltage at the top plate of capacitors ChA and ChB can begin to change due to application of the negative bias signal 5. However, the amount of this change is predictable and can be calculated. To compensate, a positive, equally shaped but scaled compensation voltage can be applied to the bottom plates of the capacitors ChA and ChB.

Extremely fast settling of mirror M to a programmed rotated position is desired, so a certain shape of bias signal 5 is used, as is discussed below and shown in FIG. 11. This can also allow for reduced resonance during movement of mirror M to the desired position.

Additionally, if a positive bias is applied to the bottom plate of capacitor ChA to increase a charge to a positive value, while keeping capacitor ChB at 0 V, or vice versa, the differential voltage stored on the respective capacitors ChA and ChB can be made single ended again. Through this operation, mirror M has the ability to achieve not just ±max distance, but 0 to ±2 max distance, thus making an asymmetrical movement possible.

It is desirable to achieve a stable position of mirror M for a few microseconds before exposure begins (e.g., before a next pulse). This can be accomplished using a slow attack and fast decay signal 5 biasing electrode 752, which is used for controlling rotation of mirror M so as not to excite eigenfrequencies or resonant frequencies of mirror M.

An update rate of patterning device PD can be 6 Khz when a radiation source SO pulse rate is 6 Khz, so each cycle is about 167 μs. About 10 μs of this time is related to the exposure phase. Although before the light pulses the mirror M needs to be stable, after the pulse the mirror M can have ringing and vibration because there is a relatively long time before a next laser pulse.

In FIG. 7, graphs 1a and 1b show an exemplary differential voltage 608 generated from analog input voltage 602 using differential amplifier 706 during a given time period. Graphs 2a and 2b show exemplary respective electrode 748 and 750 bias voltages during a given time period. Graph 3 shows an exemplary row select voltage during a given time period. Graphs 4a and 4b show exemplary capacitor ChA and ChB bottom plate voltages during a given time period. Graph 5 shows an exemplary bias electrode 752 voltage during a given time period.

Figure 8:
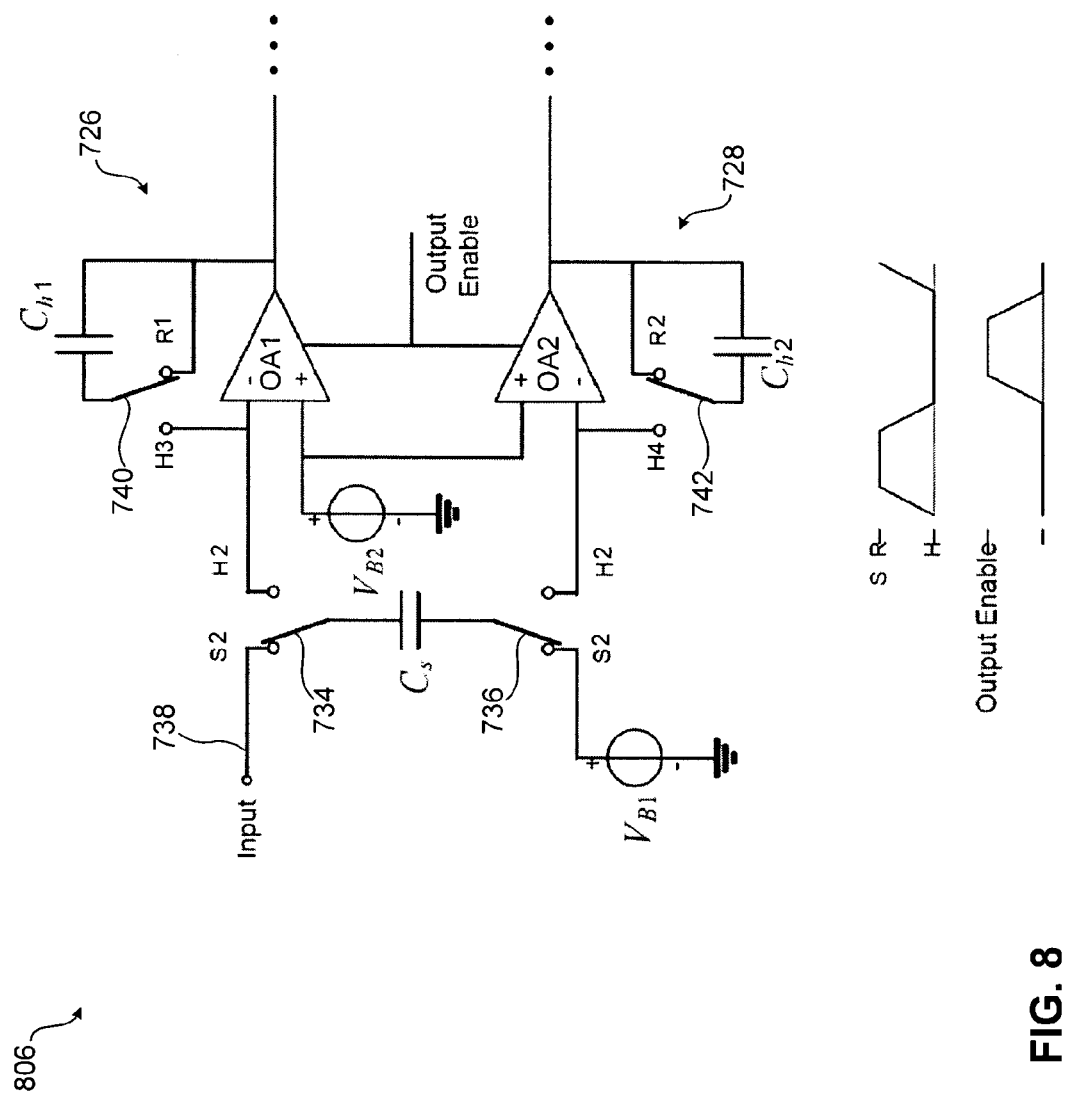
FIG. 8 shows another alternative configuration for a differential amplifier portion of the control system in FIG. 5.

FIG. 8 shows another alternative configuration for a differential amplifier portion 806 of the control system CS shown in FIG. 5. All elements with similar numbers are the same, and have a similar function, as described above with regards to FIG. 7. However, in this alternative configuration first switched capacitor portion 722 has been removed from differential amplifier 806 as compared to differential amplifier 706. This allows for a quasi differential input signal to be input based on the analog input and the bias source coupled to the second switched capacitor portion 724. Double-sample-hold allows for so-called interleaved input sampling. If interleaved input sampling is not necessary, one input sampler can be omitted.

Figure 9:
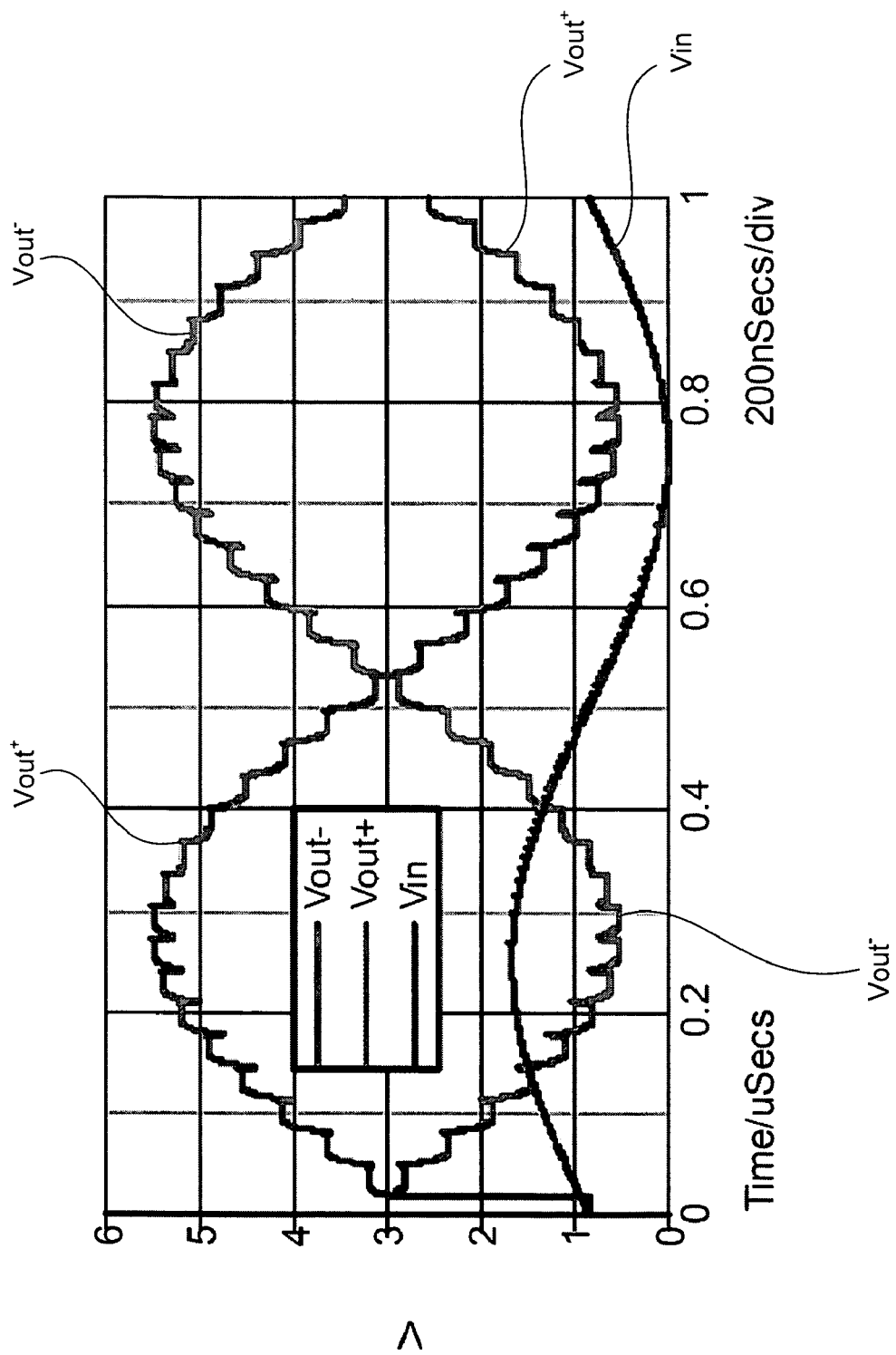
FIG. 9 shows input and output signals of a differential amplifier of FIG. 7.

FIG. 9 shows a waveform of input signal Vin and output signals Vout+ and Vout− of a differential amplifier, e.g., differential amplifier 604, 606, 706, and/or 806.

Figure 10:
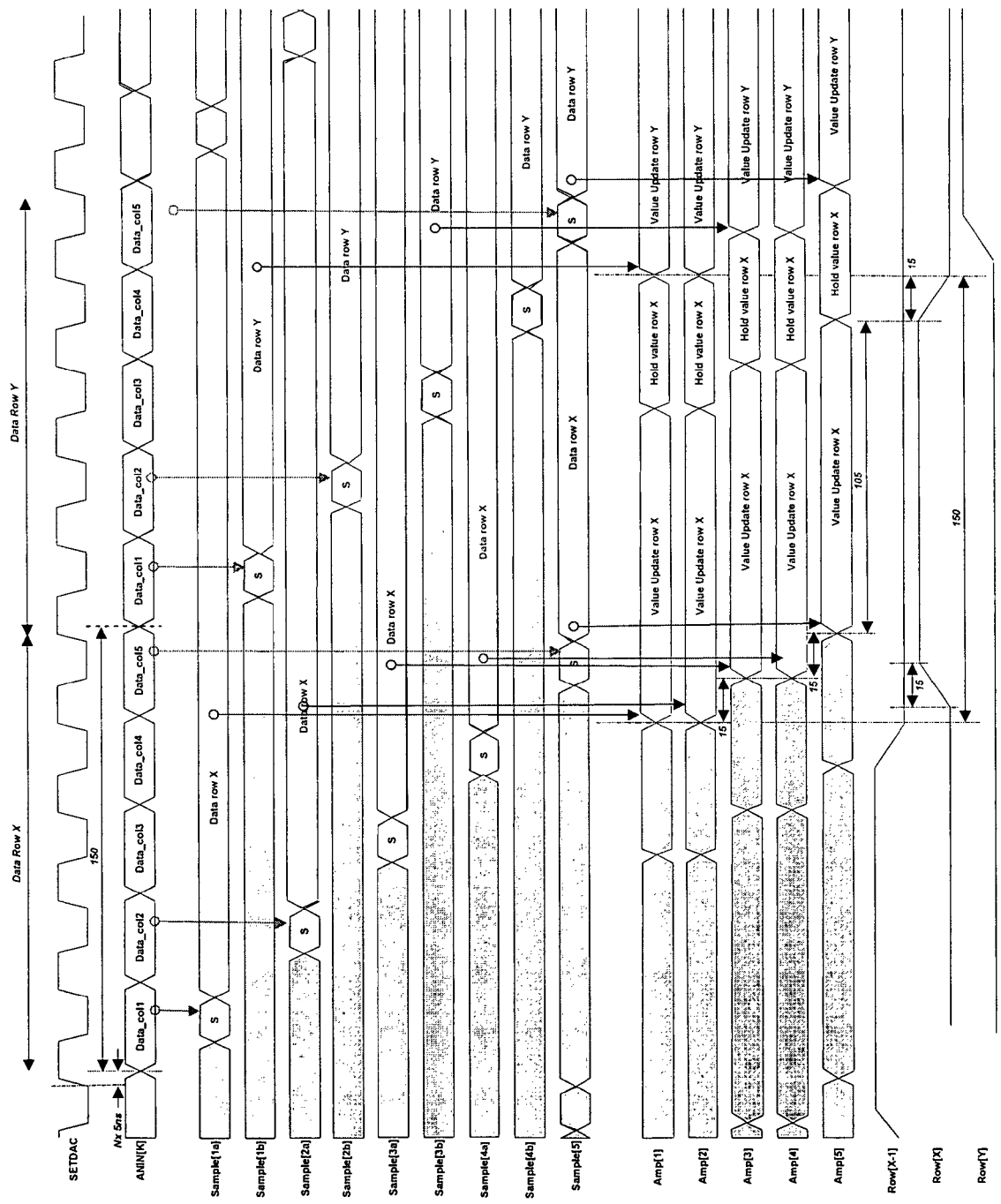
FIG. 10 shows a timing diagram, according to the present invention.

FIG. 10 shows a timing diagram, according to the present invention. As discussed above, each pin 600 is coupled to five columns of the array in patterning device PD through five of the differential amplifiers. The top signal in this diagram is a set signal, e.g., a signal coming from a digital state machine. The next set of information depicts multiple stage sampling performed using a multiple stage switched capacitor sample and hold system, for example as described above. Five of the signals comprise one sequence. Sample 1a,b: Sample 1a: first input sampler of amplifier 1 takes a sample, Sample 1 1b: second input sampler of amplifier 1 takes a sample. Similarly, this occurs for samples 2a, b to 4a, b. However amplifier 5 uses one input sampler only. Below this the diagram are shown. When output Enable is active, amplifier output achieves its desired output voltage. Outputs from the first through fifth differential amplifiers coupled to each pin 600. Below this, the diagram shows an active state of operational amplifiers OA1 and OA2 as they are turned ON, capacitors Ch1 and Ch2 hold received values. Next is shown when amplifiers OA1 and OA2 turn OFF, but do not reset, so the stored value is still available on capacitors Ch1 and Ch2 and on the column line wire capacitances (612) that serve as hold capacitances.

Figure 11:
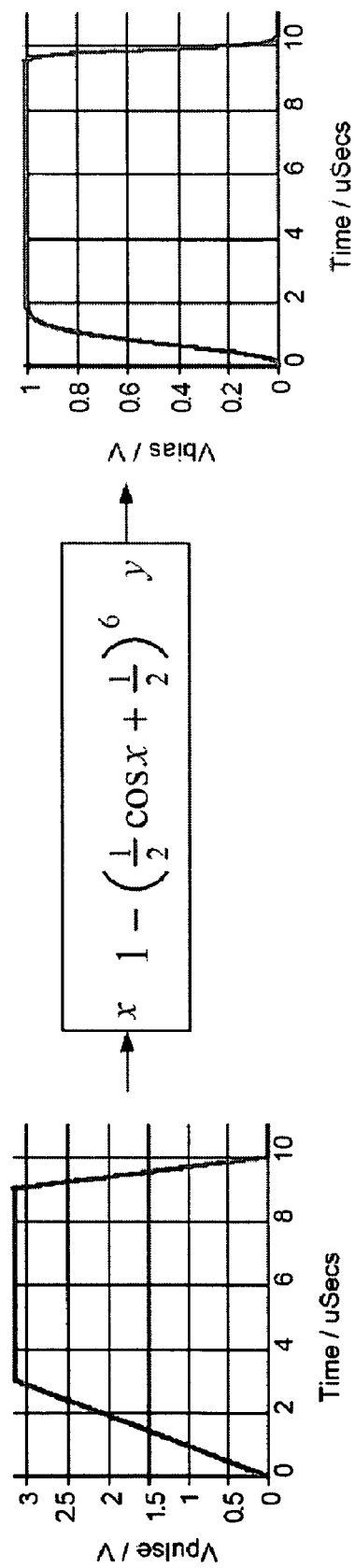
FIG. 11 shows a slow attack fast decay raised cosine bias signal, according to the present invention.

FIG. 11 shows a slow attack fast decay raised cosine bias signal used to bias electrode 752, according to the present invention.

One or more of the embodiments discussed above can allow for one or more of the following features.

The control system CS and patterning device PD signal paths are fully differential, which can allow for low patterning device PD power consumption, low lithography system power consumption, high resolution and improved linearity.

One or more of differential amplifiers 604, 606, 706, or 806 can convert a low-voltage single-ended input voltage, e.g., an analog signal 602, to a, for example, about 10V, differential mirror control voltage 608/610 (e.g., having about 7V amplifier power supply).

One or more of differential amplifiers 604, 606, 706, or 806 can maximize an available charge-up time for the mirror voltage, thereby reducing the power consumption considerably.

Maximization of the charge-up time is achieved through decoupling of the external and internal timing. The analog input pin 600 is sampled for each update at a rate that equals the product of the number of rows per quadrant, the multiplex factor, and the mirror update rate. With double sample hold operation the output update rate can be kept lower (approximately the pin update rate divided by the multiplex factor −1).

The charge-up time is maximized using double input samplers for differential amplifiers 1 to 4 of each group of five differential amplifiers. For example, this can be seen from the timing diagram from FIG. 10.

One or more of differential amplifiers 604, 606, 706, or 806 can be equipped with a high-efficient output stage that requires an extremely low bias current, while having a high output current drive capability. For example, they can include a push-pull Class A output stage (e.g., an output stage that conducts current at all times, the output current never dropping down to the zero line at any time), which is biased at a low current, and a highly non-linear Class C push-pull current boost circuit (e.g., circuit exhibiting a low gain at low power output, improving as the output power increases), which operates during large signal transients. The output of the amplifier may be switched off (high-Z) by switching off the bias current of the Class A stage (and its input driver) only.

In one example, 10 million small SiGe mirrors M (e.g., 8×8 μm) can be used as the array of individually controllable elements on the patterning device PD. The mirrors M can have a high resonance frequency (which can allow for fast-settling), no hysteresis, and a long mechanical lifetime.

Fast, resonance-free mirror positioning settling to, e.g., about 0.05% within less than about 2 μs is achieved through application of a slow-attack, fast-decay negative raised cosine pulse 5, as shown in FIG. 11, to the mirror bias electrode 752.

Offset and gain compensation as well as range programming (from −max/2 to +max/2 or 0 to ±2 max) can be obtained through application of similarly shaped positive pulses to either one or both bottom plates of the capacitors ChA and ChB, as discussed above. Also as discussed above, the mirror bias electrode 752 can be common for all quadrants through coupling of all the electrodes 752 and the capacitor ChA and ChB bottom plates can be available for each quadrant, providing gain and offset calibration per quadrant.

In one example, a testing system can be integrated into the patterning device PD including read-back analog to digital converters, amplifier input voltage applications, and hold-capacitor bottom plate voltage applications, facilitating testing of the complete analog signal path from amplifier input to hold capacitor bottom plate. Patterning device stored and read-in test patterns facilitate (optical) MEMS testing. Patterning device temperature sensors to measure temperature distribution and provide means for temperature control.

As partially discussed above, the use of one or more of differential amplifiers 604, 606, 706, or 806, or a plurality thereof, can result in, or allow for, the following features. A 25,000 times smaller required energy per bit (approximately 20 pJ/bit) is achieved, as compared to conventional systems requiring 500 nW/bit, resulting in only 12 W power dissipation for processing 600 Gbit/s. This result from low-voltage mirrors, low voltage CMOS, and on-chip single-ended to differential signal conversion. Using a low analog input voltage 602 (e.g., less than about 2 V) reduces the total patterning device PD power and the total required system power. Three times higher update rate 6 kHz for individual mirror programming can be achieved, as compared to conventional devices, and which is even higher for clustered mirror programming. Fast resonance-free mirror settling can be achieved in less than about 2 μs. An improved resolution and linearity to 10 bits can be achieved, as compared to conventional devices only exhibiting about 8 bits. The patterning device PD can be fabricated in a low-voltage, e.g. less than about 8 V, high-speed CMOS IC process. The patterning device can be configured to operate in multiple operating modes (e.g., clustered mirrors) and a mirror rotation range can be programmed from 0 to +max, −max/2 to +max/2, 0 to ∓2 max, etc. The patterning device PD can consist of four equal quadrants that have individual timing, mirror gain, and offset compensation per quadrant. The patterning device PD can have the ability to perform internal temperature profile measurement.

Using one or more of differential amplifiers 604, 606, 706, or 806 can allow for substantially lower power dissipation than conventional devices because a differential amplifier and differential signal systems typically need only half the input voltage of a single ended system. This is because they achieve double voltage through the differential signals. Using half the input voltage value allows for a quarter of power dissipation for similar conventional device. Thus, a differential output signal allows for a factor of two power reduction. A stiff, high resonant frequency, and high Q mirror M can be used.

Figure 12:
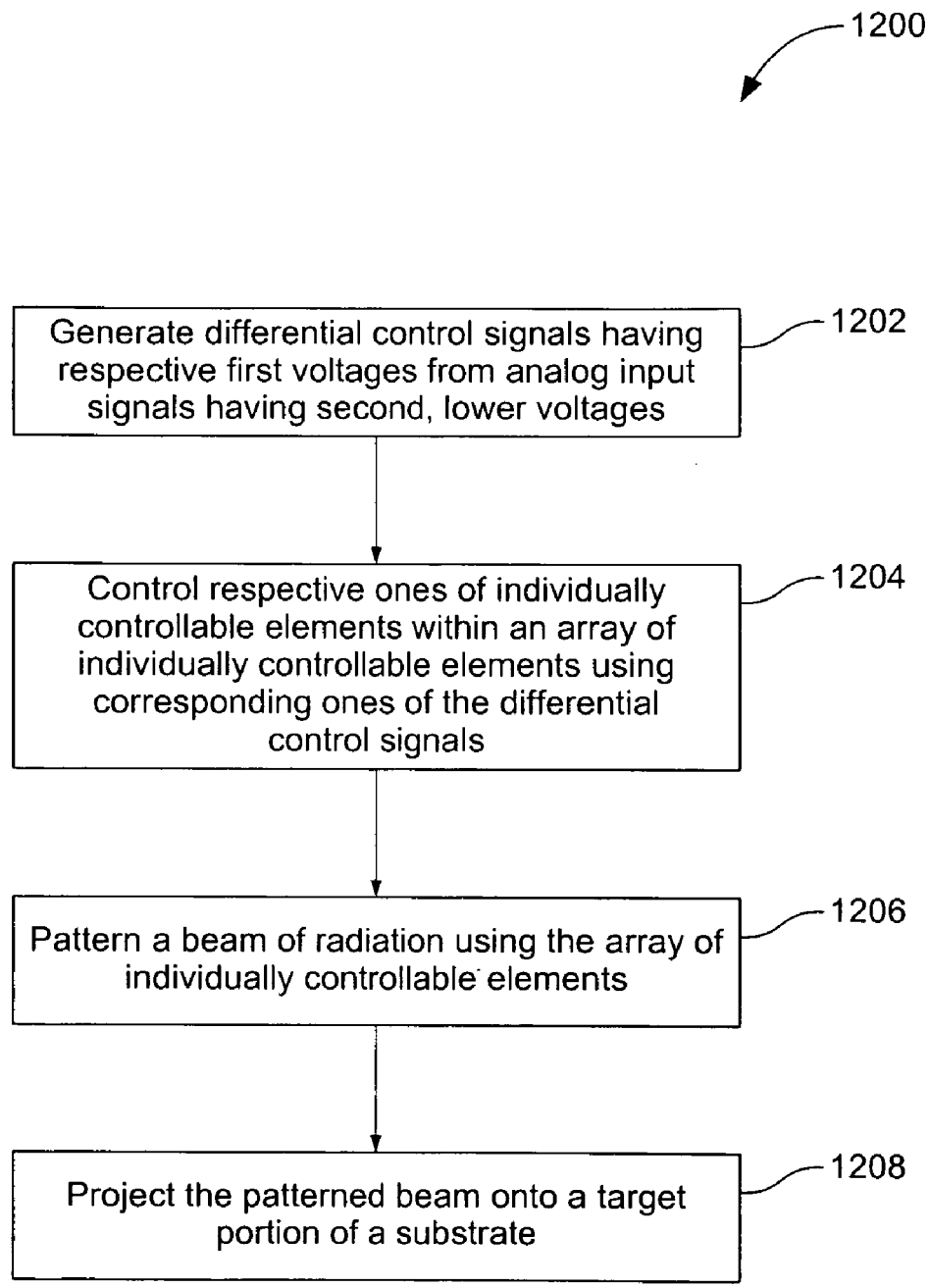
FIG. 12 shows a flowchart depicting a method, according to the present invention.

FIG. 12 shows a flowchart depicting a method 1200, according to the present invention. In step 1202, differential control signals are generated having respective first voltages from analog signals having second, lower voltages. In step 1204, respective ones of individually controllable elements within an array of individually controllable elements are controlled using corresponding ones of the differential control signals. In step 1206, a beam of radiation is patterned using the array of individually controllable elements. In step 1208, the patterned beam is projected onto a target portion of a substrate.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography apparatus, comprising:
an illumination system configured to condition a beam of radiation;
a patterning device configured to pattern the beam of radiation, the patterning device comprising,
a control system configured to convert analog signals having respective first voltage values to corresponding differential control signals having second, higher voltage values, and
an array of individually controllable elements, corresponding ones of the individually controllable elements in the array of individually controllable elements being configured to actuate based on receiving a corresponding one of the differential control signals; and
a projection system configured to project the patterned beam onto a target area of a substrate.

2. The lithographic apparatus of claim 1, wherein the control system comprises:
a plurality of pins that receive a respective one of the analog signals; and
a plurality of differential amplifiers coupled to each of the plurality of pins, each of the differential amplifiers being coupled to a respective column of individually controllable elements in the array of individually controllable elements.

3. The lithographic apparatus of claim 2, wherein the control system is configured to generate a row address signal that controls which row of the respective column receives the corresponding one of the differential control signals.

4. The lithographic apparatus of claim 3, wherein each of the single or multiple stage switched-capacitor sample and hold amplifier circuits comprise:
a switched-capacitor portion;
a bias power source coupled to the switched-capacitor portion; and
first and second operational amplifiers coupled to the switched capacitor portion.

5. The lithographic apparatus of claim 4, wherein each of the single or multiple stage switched-capacitor sample and hold amplifier circuits further comprise:
first and second capacitors coupled to feedback loops of respective ones of the first and second operational amplifiers; and
first and second switches positioned in respective ones of the feedback loops, the first and second switches configured to move between a reset position and a hold position.

6. The lithographic apparatus of claim 2, wherein each of the differential amplifiers comprises a single stage or multiple stage switched-capacitor sample and hold amplifier circuit.

7. The lithographic apparatus of claim 2, wherein each of the single or multiple stage switched-capacitor sample and hold amplifier circuits comprise:
a push-pull output stage; and
a non-linear push-pull boost circuit.

8. The lithographic apparatus of claim 2, wherein the patterning device further comprises driving sections each coupled to respective ones of the individually controllable elements, the driving sections comprising:
first and second field effect transistors having gates that receive a respective portion of the control signal from a respectively selected row select line;
first and second electrodes coupled to respective ones of the first and second field effect transistors; and
first and second capacitors coupled between respective ones of the first and second field effect transistors and the first and second electrodes,
wherein the first and second capacitors are configured to store a charge correlating to the received respective portion of the differential control signal during a programming mode, and
wherein the first and second electrodes are configured to actuate movement of a corresponding one of the individually controllable elements based on the respective stored charges during an exposure mode.

9. The lithographic apparatus of claim 8, wherein the patterning device includes four quadrants and wherein:
bottom plates of the first capacitors in each of the driving sections of each of the four quadrants are coupled together; and
bottom plates of the second capacitors in each of the driving sections of each of the four quadrants are coupled together.

10. The lithographic apparatus of claim 1, wherein the array comprises at least about 10 million of the individually controllable elements.

11. The lithographic apparatus of claim 1, wherein the individually controllable elements comprise SiGe mirrors.

12. The lithographic apparatus of claim 1, wherein the individually controllable elements comprises mirrors having about a 8 μm width and length.

13. The lithographic apparatus of claim 1, further comprising:
first and second electrodes associated with each of the individually controllable elements, wherein each of the individually controllable elements comprises a bias electrode, such that the bias electrode receives a slow attack, fast decay negative raised cosine pulse during energizing of the driving electrodes to produce fast resonant free mirror position settling in within about 2 μs.

14. The lithographic apparatus of claim 1, wherein the patterning device further comprises a testing system coupled to the array of individually controllable devices and the control system.

15. The lithographic apparatus of claim 14, wherein the testing system is configured to test the control system.

16. The lithographic apparatus of claim 14, wherein the testing system is configured to test the individually controllable elements.

17. The lithographic apparatus of claim 1, wherein the patterning device further comprises a temperature sensor or an array of temperature sensors.

18. The lithographic apparatus of claim 1, the patterning device further comprising a plurality of bias electrodes, each of the bias electrode being coupled to a respective one of the individually controllable elements.

19. The lithographic apparatus of claim 18, wherein the bias electrodes are coupled together.

20. A device manufacturing method, comprising:
generating differential control signals having respective first voltages from analog input signals having second, lower voltages;
controlling respective ones of individually controllable elements within an array of individually controllable elements using corresponding ones of the differential control signals;

patterning a beam of radiation using the array of individually controllable elements; and projecting the patterned beam onto a target portion of a substrate.

21. A patterning device, comprising:

a control system configured to convert analog signals having respective first voltage values to corresponding differential control signals having second, higher voltage values, and an array of individually controllable elements, corresponding ones of the individually controllable elements in the array of individually controllable elements being configured to actuate based on receiving a corresponding one of the differential control signals.

22. The patterning device of claim 21, wherein the control system comprises:

a plurality of pins that receive a respective one of the analog signals; and a plurality of differential amplifiers coupled to each of the plurality of pins, each of the differential amplifiers being coupled to a respective column of individually controllable elements in the array of individually controllable elements.

23. The patterning device of claim 22, wherein the control system is configured to generate a row address signal that controls which row of the respective column receives the corresponding one of the differential control signals.

24. The patterning device of claim 23, wherein each of the single or multiple stage switched-capacitor sample and hold amplifier circuits comprise:

a switched-capacitor portion;

a bias power source coupled to the switched-capacitor portion; and first and second operational amplifiers coupled to the switched capacitor portion.

25. The patterning device of claim 24, wherein each of the single or multiple stage switched-capacitor sample and hold amplifier circuits further comprise:

first and second capacitors coupled to feedback loops of respective ones of the first and second operational amplifiers; and first and second switches positioned in respective ones of the feedback loops, the first and second switches configured to move between a reset position and a hold position.

26. The patterning device of claim 22, wherein each of the differential amplifiers comprises a single stage or multiple stage switched-capacitor sample and hold amplifier circuit.

27. The patterning device of claim 22, wherein each of the single or multiple stage switched-capacitor sample and hold amplifier circuits comprise:

a push-pull output stage; and a non-linear push-pull boost circuit.

28. The patterning device of claim 22, further comprising driving sections each coupled to respective ones of the individually controllable elements, the driving sections comprising:

first and second field effect transistors having gates that receive a respective portion of the control signal from a respectively selected row select line;

first and second electrodes coupled to respective ones of the first and second field effect transistors; and first and second capacitors coupled between respective ones of the first and second field effect transistors and the first and second electrodes, wherein the first and second capacitors are configured to store a charge correlating to the received respective portion of the differential control signal during a programming mode, and wherein the first and second electrodes are configured to actuate movement of a corresponding one of the individually controllable elements based on the respective stored charges during an exposure mode.

29. The patterning device of claim 28, comprising four quadrants and wherein:

bottom plates of the first capacitors in each of the driving sections of each of the four quadrants are coupled together; and bottom plates of the second capacitors in each of the driving sections of each of the four quadrants are coupled together.

30. The patterning device of claim 21, wherein the array comprises at least about 10 million of the individually controllable elements.

31. The patterning device of claim 21, wherein the individually controllable elements comprise SiGe mirrors.

32. The patterning device of claim 31, wherein the individually controllable elements comprises mirrors having about a 8 μm width and length.

33. The patterning device of claim 31, further comprising:

first and second electrodes associated with each of the individually controllable elements, wherein each of the individually controllable elements comprises a bias electrode, such that the bias electrode receives a slow attack, fast decay negative raised cosine pulse during energizing of the driving electrodes to produce fast resonant free mirror position settling in within about 2 μs.

34. The patterning device of claim 21, further comprising a testing system coupled to the array of individually controllable devices and the control system.

35. The patterning device of claim 34, wherein the testing system is configured to test the control system.

36. The patterning device of claim 34, wherein the testing system is configured to test the individually controllable elements.

37. The patterning device of claim 21, further comprising a temperature sensor or an array of temperature sensors.

38. The patterning device of claim 21, further comprising a plurality of bias electrodes, each of the bias electrode being coupled to a respective one of the individually controllable elements.

39. The patterning device of claim 38, wherein the bias electrodes are coupled together.

* * * * *